(12) United States Patent
Michael et al.

(10) Patent No.: US 8,162,584 B2
(45) Date of Patent: Apr. 24, 2012

(54) METHOD AND APPARATUS FOR SEMICONDUCTOR WAFER ALIGNMENT

(75) Inventors: David J. Michael, Wayland, MA (US); James Clark, La Honda, CA (US); Gang Liu, Natick, MA (US)

(73) Assignee: Cognex Corporation, Natick, MA (US)

(*) Notice: Subject to any disclaimer, the term of this patent is extended or adjusted under 35 U.S.C. 154(b) by 251 days.

(21) Appl. No.: 11/508,551

(22) Filed: Aug. 23, 2006

(65) Prior Publication Data
US 2008/0050006 A1 Feb. 28, 2008

(51) Int. Cl.
*G06K 9/00* (2006.01)
*H01L 21/677* (2006.01)
(52) U.S. Cl. ........................................... 414/217
(58) Field of Classification Search .................. 382/141, 382/144; 348/86, 125; 700/95–212
See application file for complete search history.

(56) References Cited

U.S. PATENT DOCUMENTS

| | | |
|---|---|---|
| 3,816,722 A | 6/1974 | Sakoe et al. |
| 3,936,800 A | 2/1976 | Ejiri et al. |
| 3,967,100 A | 6/1976 | Shimomura |
| 3,968,475 A | 7/1976 | McMahon |
| 3,978,326 A | 8/1976 | Shimomura |
| 4,011,403 A | 3/1977 | Epstein et al. |
| 4,115,702 A | 9/1978 | Nopper |
| 4,115,762 A | 9/1978 | Akiyama et al. |
| 4,183,013 A | 1/1980 | Agrawala et al. |
| 4,200,861 A | 4/1980 | Hubach et al. |
| 4,238,780 A | 12/1980 | Doemens |
| 4,254,400 A | 3/1981 | Yoda et al. |
| 4,286,293 A | 8/1981 | Jablonowski |
| 4,300,164 A | 11/1981 | Sacks |
| 4,385,322 A | 5/1983 | Hubach et al. |
| 4,435,837 A | 3/1984 | Abernathy |
| 4,441,124 A | 4/1984 | Heebner et al. |
| 4,441,206 A | 4/1984 | Kuniyoshi et al. |
| 4,519,041 A | 5/1985 | Fant et al. |
| 4,534,813 A | 8/1985 | Williamson et al. |
| 4,541,116 A | 9/1985 | Lougheed |
| 4,545,067 A | 10/1985 | Juvin et al. |
| 4,570,180 A | 2/1986 | Baier et al. |
| 4,577,344 A | 3/1986 | Warren et al. |
| 4,581,762 A | 4/1986 | Lapidus et al. |
| 4,606,065 A | 8/1986 | Beg et al. |
| 4,617,619 A | 10/1986 | Gehly |

(Continued)

FOREIGN PATENT DOCUMENTS

EP 0 265 302 A1 9/1987

(Continued)

OTHER PUBLICATIONS

Bursky, Dave, "CMOS Four-Chip Set Process Images at 20-MHz Data Rates," Electronic Design, May 28, 1987, pp. 39-44.

(Continued)

*Primary Examiner* — Daniel Mariam
*Assistant Examiner* — Elisa M Rice
(74) *Attorney, Agent, or Firm* — David J. Powsner

(57) ABSTRACT

The invention provides, in some aspects, a wafer alignment system comprising an image acquisition device, an illumination source, a rotatable wafer platform, and an image processor that includes functionality for mapping coordinates in an image of an article (such as a wafer) on the platform to a "world" frame of reference at each of a plurality of angles of rotation of the platform.

21 Claims, 2 Drawing Sheets

U.S. PATENT DOCUMENTS

| | | |
|---|---|---|
| 4,630,306 A | 12/1986 | West et al. |
| 4,631,750 A | 12/1986 | Gabriel et al. |
| 4,641,349 A | 2/1987 | Flom et al. |
| 4,688,088 A | 8/1987 | Hamazaki et al. |
| 4,697,075 A | 9/1987 | Roos et al. |
| 4,706,168 A | 11/1987 | Weisner |
| 4,707,647 A | 11/1987 | Coldren et al. |
| 4,728,195 A | 3/1988 | Silver |
| 4,730,260 A | 3/1988 | Mori et al. |
| 4,731,858 A | 3/1988 | Grasmueller et al. |
| 4,736,437 A | 4/1988 | Sacks et al. |
| 4,742,551 A | 5/1988 | Deering |
| 4,752,898 A | 6/1988 | Koenig |
| 4,758,782 A | 7/1988 | Kobayashi |
| 4,764,870 A | 8/1988 | Haskin |
| 4,771,469 A | 9/1988 | Wittenburg |
| 4,776,027 A | 10/1988 | Hisano et al. |
| 4,782,238 A | 11/1988 | Radl et al. |
| 4,783,826 A | 11/1988 | Koso |
| 4,783,828 A | 11/1988 | Sadjadi |
| 4,783,829 A | 11/1988 | Miyakawa et al. |
| 4,803,735 A | 2/1989 | Nishida et al. |
| 4,809,077 A | 2/1989 | Norita et al. |
| 4,821,333 A | 4/1989 | Gillies |
| 4,831,580 A | 5/1989 | Yamada |
| 4,860,374 A | 8/1989 | Murakami et al. |
| 4,860,375 A | 8/1989 | McCubbrey et al. |
| 4,876,457 A | 10/1989 | Bose |
| 4,876,728 A | 10/1989 | Roth |
| 4,891,767 A | 1/1990 | Rzasa et al. |
| 4,903,218 A | 2/1990 | Longo et al. |
| 4,907,169 A | 3/1990 | Lovoi |
| 4,908,874 A | 3/1990 | Gabriel |
| 4,912,559 A | 3/1990 | Ariyoshi et al. |
| 4,912,659 A | 3/1990 | Liang |
| 4,914,553 A | 4/1990 | Hamada et al. |
| 4,922,543 A | 5/1990 | Ahlbom et al. |
| 4,924,086 A | 5/1990 | Webber |
| 4,926,492 A | 5/1990 | Tanaka et al. |
| 4,932,065 A | 6/1990 | Feldgajer |
| 4,953,224 A | 8/1990 | Ichinose et al. |
| 4,955,062 A | 9/1990 | Terui |
| 4,959,898 A | 10/1990 | Landman et al. |
| 4,962,423 A | 10/1990 | Yamada et al. |
| 4,969,037 A | 11/1990 | Poleschinski et al. |
| 4,972,359 A | 11/1990 | Silver et al. |
| 4,982,438 A | 1/1991 | Usami et al. |
| 5,005,126 A | 4/1991 | Haskin |
| 5,012,402 A | 4/1991 | Akiyama |
| 5,012,433 A | 4/1991 | Callahan et al. |
| 5,012,524 A | 4/1991 | Le Beau |
| 5,027,419 A | 6/1991 | Davis |
| 5,046,190 A | 9/1991 | Daniel et al. |
| 5,048,094 A | 9/1991 | Aoyama et al. |
| 5,054,096 A | 10/1991 | Beizer |
| 5,060,276 A | 10/1991 | Morris et al. |
| 5,063,608 A | 11/1991 | Siegel |
| 5,073,958 A | 12/1991 | Imme |
| 5,081,656 A | 1/1992 | Baker et al. |
| 5,081,689 A | 1/1992 | Meyer et al. |
| 5,083,073 A | 1/1992 | Kato |
| 5,086,478 A | 2/1992 | Kelly-Mahaffey et al. |
| 5,090,576 A | 2/1992 | Menten |
| 5,091,861 A | 2/1992 | Geller et al. |
| 5,091,968 A | 2/1992 | Higgins et al. |
| 5,093,867 A | 3/1992 | Hori et al. |
| 5,113,565 A | 5/1992 | Cipolla et al. |
| 5,115,309 A | 5/1992 | Hang |
| 5,119,435 A | 6/1992 | Berkin |
| 5,124,622 A | 6/1992 | Kawamura et al. |
| 5,133,022 A | 7/1992 | Weideman |
| 5,134,575 A | 7/1992 | Takagi |
| 5,143,436 A | 9/1992 | Baylor et al. |
| 5,145,432 A | 9/1992 | Midland et al. |
| 5,151,951 A | 9/1992 | Ueda et al. |
| 5,153,925 A | 10/1992 | Tanioka et al. |
| 5,155,775 A | 10/1992 | Brown |
| 5,159,281 A | 10/1992 | Hedstrom et al. |
| 5,159,645 A | 10/1992 | Kumagai |
| 5,164,994 A | 11/1992 | Bushroe |
| 5,168,269 A | 12/1992 | Harlan |
| 5,175,808 A | 12/1992 | Sayre |
| 5,179,419 A | 1/1993 | Palmquist et al. |
| 5,185,810 A | 2/1993 | Freischlad |
| 5,185,855 A | 2/1993 | Kato et al. |
| 5,189,712 A | 2/1993 | Kajiwara et al. |
| 5,204,944 A | 4/1993 | Wolberg et al. |
| 5,206,820 A | 4/1993 | Ammann et al. |
| 5,216,503 A | 6/1993 | Paik |
| 5,225,940 A | 7/1993 | Ishii et al. |
| 5,230,027 A | 7/1993 | Kikuchi |
| 5,243,607 A | 9/1993 | Masson et al. |
| 5,253,306 A | 10/1993 | Nishio |
| 5,253,308 A | 10/1993 | Johnson |
| 5,259,038 A | 11/1993 | Sakou et al. |
| 5,265,173 A | 11/1993 | Griffin et al. |
| 5,271,068 A | 12/1993 | Ueda et al. |
| 5,287,449 A | 2/1994 | Kojima |
| 5,297,238 A | 3/1994 | Wang et al. |
| 5,297,256 A | 3/1994 | Wolstenholme et al. |
| 5,299,269 A | 3/1994 | Gaborski et al. |
| 5,307,419 A | 4/1994 | Tsujino et al. |
| 5,311,598 A | 5/1994 | Bose et al. |
| 5,315,388 A | 5/1994 | Shen et al. |
| 5,319,457 A | 6/1994 | Nakahashi et al. |
| 5,327,156 A | 7/1994 | Masukane et al. |
| 5,329,469 A | 7/1994 | Watanabe |
| 5,337,262 A | 8/1994 | Luthi et al. |
| 5,337,267 A | 8/1994 | Colavin |
| 5,363,507 A | 11/1994 | Nakayama et al. |
| 5,367,439 A | 11/1994 | Mayer et al. |
| 5,367,667 A | 11/1994 | Wahlquist et al. |
| 5,371,690 A | 12/1994 | Engel et al. |
| 5,371,836 A | 12/1994 | Mitomi et al. |
| 5,381,004 A | 1/1995 | Uritsky et al. |
| 5,388,197 A | 2/1995 | Rayner |
| 5,388,252 A | 2/1995 | Dreste et al. |
| 5,398,292 A | 3/1995 | Aoyama |
| 5,432,525 A | 7/1995 | Maruo et al. |
| 5,440,699 A | 8/1995 | Farrand et al. |
| 5,455,870 A | 10/1995 | Sepai et al. |
| 5,455,933 A | 10/1995 | Schieve et al. |
| 5,471,312 A | 11/1995 | Watanabe et al. |
| 5,475,766 A | 12/1995 | Tsuchiya et al. |
| 5,475,803 A | 12/1995 | Stearns et al. |
| 5,477,138 A | 12/1995 | Erjavic et al. |
| 5,481,712 A | 1/1996 | Silver et al. |
| 5,485,570 A | 1/1996 | Busboom et al. |
| 5,491,780 A | 2/1996 | Fyles et al. |
| 5,495,424 A | 2/1996 | Tokura |
| 5,495,537 A | 2/1996 | Bedrosian et al. |
| 5,496,106 A | 3/1996 | Anderson |
| 5,497,007 A | 3/1996 | Uritsky et al. |
| 5,500,906 A | 3/1996 | Picard et al. |
| 5,506,617 A | 4/1996 | Parulski et al. |
| 5,506,682 A | 4/1996 | Pryor |
| 5,511,015 A | 4/1996 | Flockencier |
| 5,519,840 A | 5/1996 | Matias et al. |
| 5,526,050 A | 6/1996 | King et al. |
| 5,528,703 A | 6/1996 | Lee |
| 5,532,739 A | 7/1996 | Garakani et al. |
| 5,539,409 A | 7/1996 | Mathews et al. |
| 5,544,256 A | 8/1996 | Brecher et al. |
| 5,548,326 A | 8/1996 | Michael |
| 5,550,763 A | 8/1996 | Michael |
| 5,550,888 A | 8/1996 | Neitzel et al. |
| 5,553,859 A | 9/1996 | Kelly et al. |
| 5,557,410 A | 9/1996 | Huber et al. |
| 5,557,690 A | 9/1996 | O'Gorman et al. |
| 5,559,904 A | 9/1996 | Holzmann |
| 5,566,877 A | 10/1996 | McCormack |
| 5,568,563 A | 10/1996 | Tanaka et al. |
| 5,574,668 A | 11/1996 | Beaty |
| 5,574,801 A | 11/1996 | Collet-Beillon |
| 5,581,632 A | 12/1996 | Koljonen et al. |
| 5,583,949 A | 12/1996 | Smith et al. |
| 5,583,954 A | 12/1996 | Garakani |

| | | |
|---|---|---|
| 5,585,917 A | 12/1996 | Woite et al. |
| 5,586,058 A | 12/1996 | Aloni et al. |
| 5,592,562 A | 1/1997 | Rooks |
| 5,594,859 A | 1/1997 | Palmer et al. |
| 5,598,345 A | 1/1997 | Tokura |
| 5,602,937 A | 2/1997 | Bedrosian et al. |
| 5,608,490 A | 3/1997 | Ogawa |
| 5,608,872 A | 3/1997 | Schwartz et al. |
| 5,621,811 A | 4/1997 | Roder et al. |
| 5,627,915 A | 5/1997 | Rosser et al. |
| 5,640,199 A | 6/1997 | Garakani et al. |
| 5,640,200 A | 6/1997 | Michael |
| 5,642,158 A | 6/1997 | Petry, III et al. |
| 5,647,009 A | 7/1997 | Aoki et al. |
| 5,649,032 A | 7/1997 | Burt et al. |
| 5,652,658 A | 7/1997 | Jackson et al. |
| 5,657,403 A | 8/1997 | Wolff et al. |
| 5,673,334 A | 9/1997 | Nichani et al. |
| 5,675,358 A | 10/1997 | Bullock et al. |
| 5,676,302 A | 10/1997 | Petry, III |
| 5,684,530 A | 11/1997 | White |
| 5,696,848 A | 12/1997 | Patti et al. |
| 5,715,369 A | 2/1998 | Spoltman et al. |
| 5,715,385 A | 2/1998 | Stearns et al. |
| 5,717,785 A | 2/1998 | Silver |
| 5,724,439 A | 3/1998 | Mizuoka et al. |
| 5,734,807 A | 3/1998 | Sumi |
| 5,739,846 A | 4/1998 | Gieskes |
| 5,739,913 A | 4/1998 | Wallace |
| 5,740,285 A | 4/1998 | Bloomberg et al. |
| 5,742,037 A | 4/1998 | Scola et al. |
| 5,751,853 A | 5/1998 | Michael |
| 5,754,679 A | 5/1998 | Koljonen et al. |
| 5,757,956 A | 5/1998 | Koljonen et al. |
| 5,761,326 A | 6/1998 | Brady et al. |
| 5,761,337 A | 6/1998 | Nishimura et al. |
| 5,768,443 A | 6/1998 | Michael et al. |
| 5,793,899 A | 8/1998 | Wolff et al. |
| 5,796,386 A | 8/1998 | Lipscomb et al. |
| 5,796,868 A | 8/1998 | Dutta-Choudhury |
| 5,801,966 A | 9/1998 | Ohashi |
| 5,805,722 A | 9/1998 | Cullen et al. |
| 5,809,658 A | 9/1998 | Jackson et al. |
| 5,818,443 A | 10/1998 | Schott |
| 5,822,055 A | 10/1998 | Tsai et al. |
| 5,825,483 A | 10/1998 | Michael et al. |
| 5,825,913 A | 10/1998 | Rostami et al. |
| 5,835,099 A | 11/1998 | Marimont |
| 5,835,622 A | 11/1998 | Koljonen et al. |
| 5,845,007 A | 12/1998 | Ohashi et al. |
| 5,847,714 A | 12/1998 | Naqvi et al. |
| 5,848,189 A | 12/1998 | Pearson et al. |
| 5,850,466 A | 12/1998 | Schott |
| 5,859,923 A | 1/1999 | Petry, III et al. |
| 5,861,909 A | 1/1999 | Garakani et al. |
| 5,870,495 A | 2/1999 | Mancuso et al. |
| 5,872,870 A | 2/1999 | Michael |
| 5,878,152 A | 3/1999 | Sussman |
| 5,900,975 A | 5/1999 | Sussman |
| 5,901,241 A | 5/1999 | Koljonen et al. |
| 5,909,504 A | 6/1999 | Whitman |
| 5,912,768 A | 6/1999 | Sissom et al. |
| 5,912,984 A | 6/1999 | Michael et al. |
| 5,918,196 A | 6/1999 | Jacobson |
| 5,933,523 A | 8/1999 | Drisko et al. |
| 5,943,441 A | 8/1999 | Michael |
| 5,949,901 A | 9/1999 | Nichani et al. |
| 5,953,130 A | 9/1999 | Benedict et al. |
| 5,960,125 A | 9/1999 | Michael et al. |
| 5,974,169 A | 10/1999 | Bachelder |
| 5,974,365 A | 10/1999 | Mitchell |
| 5,978,080 A | 11/1999 | Michael et al. |
| 5,978,081 A * | 11/1999 | Michael et al. ............ 356/243.1 |
| 5,978,502 A | 11/1999 | Ohashi |
| 5,978,521 A | 11/1999 | Wallack et al. |
| 5,982,132 A * | 11/1999 | Colby ........................... 318/649 |
| 5,982,474 A | 11/1999 | Akiyama et al. |
| 6,002,738 A | 12/1999 | Cabral et al. |
| 6,002,793 A | 12/1999 | Silver et al. |

| | | |
|---|---|---|
| 6,016,152 A | 1/2000 | Dickie |
| 6,025,854 A | 2/2000 | Hinz et al. |
| 6,025,905 A | 2/2000 | Sussman |
| 6,026,176 A | 2/2000 | Whitman |
| 6,067,379 A | 5/2000 | Silver |
| 6,069,668 A | 5/2000 | Woodham, Jr. et al. |
| 6,075,881 A | 6/2000 | Foster et al. |
| 6,084,631 A | 7/2000 | Tonkin et al. |
| 6,118,540 A | 9/2000 | Roy et al. |
| 6,137,893 A | 10/2000 | Michael et al. |
| 6,141,033 A | 10/2000 | Michael et al. |
| 6,141,040 A | 10/2000 | Toh |
| 6,170,973 B1 | 1/2001 | Benedict |
| 6,188,784 B1 | 2/2001 | Linker, Jr. |
| 6,191,850 B1 | 2/2001 | Chiang |
| 6,215,915 B1 | 4/2001 | Reyzin |
| 6,236,769 B1 | 5/2001 | Desai |
| 6,259,827 B1 | 7/2001 | Nichani |
| 6,275,742 B1 | 8/2001 | Sagues et al. |
| 6,282,328 B1 | 8/2001 | Desai |
| 6,298,149 B1 | 10/2001 | Nichani et al. |
| 6,301,396 B1 | 10/2001 | Michael et al. |
| 6,341,878 B1 | 1/2002 | Chiang |
| 6,381,366 B1 | 4/2002 | Taycher et al. |
| 6,381,375 B1 | 4/2002 | Reyzin |
| 6,389,029 B1 | 5/2002 | McAlear |
| 6,396,949 B1 | 5/2002 | Nichani |
| 6,442,291 B1 | 8/2002 | Whitman |
| 6,477,275 B1 | 11/2002 | Melikian et al. |
| 6,516,092 B1 | 2/2003 | Bachelder et al. |
| 6,639,624 B1 | 10/2003 | Bachelder et al. |
| 6,658,145 B1 | 12/2003 | Silver et al. |
| 6,684,402 B1 | 1/2004 | Wolff |
| 6,728,582 B1 | 4/2004 | Wallack |
| 6,748,104 B1 | 6/2004 | Bachelder et al. |
| 6,771,808 B1 | 8/2004 | Wallack |
| 6,850,646 B1 | 2/2005 | Silver et al. |
| 6,856,698 B1 | 2/2005 | Silver et al. |
| 6,900,877 B2 | 5/2005 | Raaijmakers |
| 6,914,679 B2 | 7/2005 | Nettekoven et al. |
| 6,933,172 B2 | 8/2005 | Tomimatsu |
| 7,006,669 B1 | 2/2006 | Lavagnino et al. |
| 7,042,568 B2 | 5/2006 | Mayo |
| 7,048,400 B2 | 5/2006 | Murasko et al. |
| 7,225,734 B2 | 6/2007 | Schanz |
| 7,295,314 B1 | 11/2007 | Spady et al. |
| 2005/0007792 A1 | 1/2005 | Li |

FOREIGN PATENT DOCUMENTS

| | | |
|---|---|---|
| EP | 0 341 122 A1 | 4/1989 |
| EP | 0 527 632 A2 | 2/1993 |
| EP | 0 777 381 A2 | 6/1997 |
| EP | 0 895 696 B1 | 2/1999 |
| FR | 2 598 019 | 10/1987 |
| WO | WO 91/10968 | 7/1991 |
| WO | WO 95/11491 | 4/1995 |
| WO | WO 95/21376 | 8/1995 |
| WO | WO 95/22137 | 8/1995 |
| WO | WO 97/21189 | 6/1997 |
| WO | WO 97/22858 | 6/1997 |
| WO | WO 97/24692 | 7/1997 |
| WO | WO 97/24693 | 7/1997 |
| WO | WO 97/39416 | 10/1997 |
| WO | WO 98/30890 | 7/1998 |
| WO | WO 98/52349 | 11/1998 |
| WO | WO 98/59490 | 12/1998 |
| WO | WO 99/15864 | 4/1999 |
| WO | WO 99/27456 | 6/1999 |
| WO | WO 99/48000 | 9/1999 |
| WO | WO 02/099615 | 12/2002 |
| WO | WO 02/100068 | 12/2002 |
| WO | WO 2007/044629 | 4/2007 |

OTHER PUBLICATIONS

Chapter 3: "Guidelines for Developing MMX Code," Intel.
Chapter 4: "MMX Code Development Strategy," Intel.
Chapter 5: "MMX Coding Techniques," Intel.
Chapter 3: "Optimization Techniques for Integer Blended Code," Intel.

"Geometrical Image Modification," pp. 421-442.

Gevorkian David Z., Astola Jaakko T., and Atourian Samvel M. "Improving Gil-Werman Algorithm for Running Min and Max Filters" IEEE Transactions on Pattern Analysis and Machine Intelligence, vol. 19, No. 5, May 1997, pp. 526-529.

Gil, Joseph and Werman Michael. "Computing 2-D Min, Median, and Max Filters" IEEE Transactions on Pattern Analysis and Machine Intelligence, vol. 15, No. 5, May 1993, pp. 504-507.

Grimson, W. Eric L. and Huttenlocher, Daniel P., "On the Sensitivity of the Hough Transform for Object Recognition", May 1990, IEEE Transactions on Pattern Analysis and Machine Intelligence, vol. 12, No. 3.

Horn, Berthold Klaus Paul. "Robot Vision", The Massachusetts Institute for Technology, 1986.

Medina-Mora et al. (1981) An Incremental Programming Environment, IEEE Transactions on Software Eng. SE-7:472-482.

NEC Electronics Inc., PD7281 Image Pipelined Processor, Product Information Brochure, pp. 2-169-2-211.

Newsletter from Acquity Imaging, Inc., "Remote Vision Support Package—The Phones Are Ringing!," 1 page.

PictureTel Corporation Product Brochure "Picturetel Live PCS 100(tm) Personal Visual Communications System," 3 pp. (1993).

PictureTel Corporation Product Brochure "Picturetel System 1000: Complete VideoConference for Cost Sensitive Applications," 4 pp. (1993).

PictureTel Corporation Product Brochure, "Picturetel System 4000(tm) A Family of Models to Fit Your Application From Offices to Boardrooms, Classrooms, and Auditoriums," 4 pp. (1993).

Plessey Semiconductors, Preliminary Information, May 1986, Publication No. PS2067, May 1986, pp. 1-5.

Pratt, William K. Digital Image Processing (2nd Ed.), 1991, pp. 421-445.

Racca Roberto G., Stephenson Owen, and Clements Reginald M. High-speed video analysis system using multiple shuttered charge-coupled device imagers and digital storage. Optical Engineering (Jun. 1992) 31;6.

Ray, R: "Automated inspection of solder bumps using visual signatures of specular image-highlights," Computer Vision and Pattern Recognition, 1989. Proceedings CVPR '89. pp. 588-596.

Rosenfeld, Azriel. "Computer Vision: Basic Principles," Proceedings of the IEEE. vol. 76, No. 8, Aug. 1988. pp. 863-868.

Symantec Corporation, "The Norton pcANYWHERE User's Guide," Table of Contents 8 pp; Introduction of pcANYWHERE Technology pp. i-vii; Chapter 7—Sessions; pp. 191-240 (1991).

Teitelbaum et al. (19810 The Cornell Program Synthesizer: A Syntax-Directed Programming Environment, Communications of the ACM 24:563-573.

Tsai, Roger Y. "A Versatile Camera Calibration Technique for High-Accuracy 3D Mahcine Vision Metrology Using Off-the-Shelf TV Cameras and Lenses," The Journal of Robotics and Automation, Vol RA-3, No. 4, Aug. 1987, pp. 323-344.

Tsai, Roger Y. "An Efficient and Accurate Camera Calibration Technique for 3D Machine Vision," Proceedings IEEE Conference on Computer Vision and Pattern Recognition Jun. 22-26, 1986, pp. 364-374.

Turney, Jerry L. "Recognizing Partially Occluded Parts," IEEE Transactions on Pattern Analysis and Machine Intelligence, PAMI-7 (1985) July, No. 4, pp. 410-421.

Unser, Michael. "Convolution-Based Interpolation for Fast, High-Quality Rotation of Images," IEEE Transactions on Image Processing vol. 4 No. 10 (Oct. 1995) pp. 1371-1381.

Viitanen, Jouko, et al. "Hierarchical pattern matching with an efficient method for estimating rotations," Proceedings IECON '87 International Conference on Industrial Electronics, Control, and Instrumentation, Nov. 3-6, 1987, 6 pp.

Wu, Yifeng and Maitre, Henri. "Registration of a SPOT Image and a SAR Image Using Multiresolution Representation of a Coastline," 10th International Conference on Pattern Recognition Jun. 16-21, 1990, pp. 913-917.

The International Search Report and Written Opinion of the International Searching Authority; International Appl. No. PCT/US07/18752, Jul. 30, 2008.

Office Action ROC (Taiwan) Pat. Application No. 096131155, Issued Apr. 29, 2011.

* cited by examiner

METHOD AND APPARATUS FOR SEMICONDUCTOR WAFER ALIGNMENT

BACKGROUND OF THE INVENTION

The invention pertains to machine vision. It has application, by way of example, in alignment of wafers during semiconductor wafer fabrication.

Semiconductor chip manufacture is a multistage process in which silicon or other wafers are subjected to a series of processing steps by modular wafer processing units or "systems." Those units, each of which typically performs one or more dedicated processing steps, are arrayed along the floor of a factory or "fab." Wafers are transported among and between the units by conveyors, robots and so forth.

Before a wafer can be processed by a processing system, the wafer's position and alignment must be established. This insures that lithography and/or other steps performed by the unit are properly directed, both with respect to features inherent to the wafer (e.g., directionally-oriented crystalline structures) and with respect to processing already (or to be) performed on it by other units.

In most of today's modular wafer fabrication systems, initial alignment of the wafer is performed by a mechanical pre-aligner that spins the wafer and uses a linear camera to find the wafer's alignment indicator (e.g., a notch or "flat" along the perimeter of the round wafer). Once it finds the notch (or flat), the pre-aligner spins a chuck and platform on which the wafer sits in order to orient the wafer to a known angle and, thereby, to ready it for processing within the unit. The pre-aligner may be used repeatedly during processing of a single wafer and/or prior to its transfer to another unit in the fab.

A problem with today's pre-aligners is that they are expensive and slow. They can cost up to $20,000 and typically require up to five seconds to perform an alignment. Since each additional second consumed during pre-alignment can cost the fab thousands of dollars, or more, it is desirable to reduce those times, as well as the cost of the pre-aligners themselves. Another problem is that they can be inaccurate and/or require touching the backside of each wafer. Since today's pre-aligners spin wafers on a mechanical chuck, they can only be as accurate as allowed by the mechanical tolerances of the spinning chuck.

An object of the invention is to provide improved methods and apparatus for machine vision.

A related object is to provide such methods and apparatus as can be applied in semiconductor wafer fabrication.

Still further objects are to provide such methods and apparatus as can be applied in alignment of wafers.

Yet still further objects of the invention are to provide such methods and apparatus as can be used in wafer fabrication systems.

Still yet further objects of the invention are to provide such methods and apparatus as operate quickly.

Yet still yet further objects of the invention are to provide such methods and apparatus as can be implemented at low cost.

Further objects of the invention are to provide such methods and apparatus as improve the accuracy of pre-aligners so as to handle the smaller tolerances of each successive generation of semiconductor manufacturing technology.

Still further objects of the invention are to provide such methods and apparatus as facilitate the use of pre-aligners that avoid touching the backside of wafers that are being processed and that, therefore, improve yield by reducing contamination.

Still yet further objects of the invention are to provide such methods and apparatus as can be used with extant and future wafer fabrication processes and equipment.

SUMMARY OF THE INVENTION

The foregoing are among the objects attained by the invention which provides, in some aspects, a wafer alignment system comprising an image acquisition device, an illumination source, a rotatable wafer platform, and an image processor that includes functionality for mapping coordinates in an image of an article (such as a wafer) on the platform to a "world" frame of reference at each of a plurality of angles of rotation of the platform.

Related aspects of the invention provide a wafer alignment system as described above in which the platform holds the article (e.g., wafer) on a plane having a normal that precesses as the platform rotates.

Further related aspects of the invention provide such systems in which the platform is disposed on and rotationally coupled to a chuck, the axis of rotation of which is not normal to the holding plane of the platform. Accordingly, the platform rotates as the chuck rotates and the normal to the platform's holding plane precesses during the course of that rotation.

In other aspects, the invention provides such systems in which the world frame of reference is independent of one or more frames of reference defined by the platform, e.g., at its various angles of rotation. In further related aspects of the invention, the world frame of reference is planar.

According to further aspects of the invention, the mapping functionality comprises a discrete function, mapping coordinates in an image of an article (e.g., wafer) on the platform to the world frame of reference for each of two or more discrete angles of the platform. In other aspects of the invention, the mapping functionality comprises a continuous function, mapping coordinates in an image of an article (e.g., wafer) on the platform to the world frame of reference as a continuous function of the angle of the platform.

In still further aspects, the invention provides a system as described above in which the illumination source provides backlighting for the article (e.g., wafer) on the platform. In related aspects, the source provides that backlighting at an angle parallel to the normal to the holding plane of the platform. In still further related aspects of the invention, the source is disposed in the holding plane of the platform. In yet further related aspects of the invention, the source comprises a planar source that is disposed between the article (e.g., wafer) and the platform. According to further related aspects of the invention, the source comprises an electroluminescent light source.

Other aspects of the invention provide a system as described above in which the image acquisition device is arranged to acquire an image of the entire article (e.g., wafer)—or, at least, of a sufficient portion thereof to enable determination of the article's (or a characteristic's thereof) position and/or orientation—in a single field of view.

Still other aspects of the invention provide a system as described above in which the image processor comprises functionality for determining at least one of a position and orientation of an article disposed on the platform as a function of one or more features shown in the image (e.g., in the frame of reference of the image acquisition device and/or in the world frame of reference).

Further aspects of the invention provide methods for wafer alignment paralleling operation of the system described above. Such aspects include, for example, acquiring an image of an article (e.g., wafer) on the platform, determining in the frame of reference of the image acquisition device any of a position and orientation of the article (or of a feature thereon), and converting that position and/or orientation to the world frame of reference. The position and/or orientation so converted can be used, e.g., by a robotic arm (or otherwise) to position the article for further processing or inspection.

These and other aspects of the invention are evident in the drawings and in the description that follows.

BRIEF DESCRIPTION OF THE DRAWINGS

A more complete understanding of the invention may be attained by reference to the drawings, in which.

DETAILED DESCRIPTION OF THE ILLUSTRATED EMBODIMENT

Figure 1:
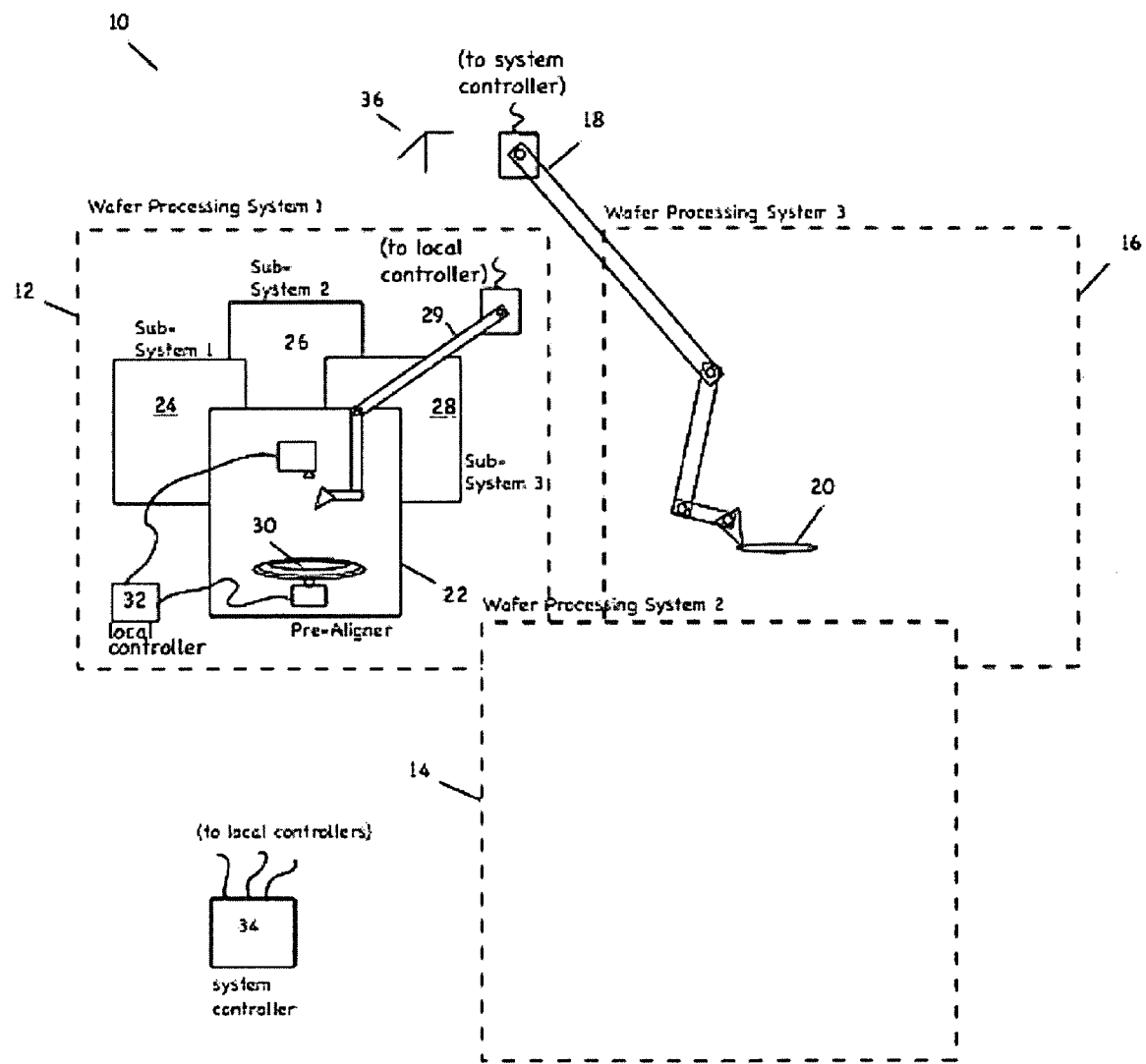
FIG. 1 depicts a wafer fabrication facility of the type in which the invention is practiced.

FIG. 1 depicts a wafer fabrication facility 10 including a plurality of wafer processing units or systems 12-16. The facility 10 can be wafer "fab," foundry, laboratory or any other fabrication facility of the type known in the art. The wafer processing systems 12-16 are also of the type known in the art for performing processing steps, such as lithography, and so forth, on wafers. One or more of those units may be adapted to include a wafer pre-alignment subsystem according to the invention, as described below and elsewhere herein.

In the illustrated embodiment, those units 12-16 are arrayed along a floor of the facility 10, though, in other embodiments they may be disposed otherwise (e.g., in separate processing areas of a single facility, dispersed among remote facilities, and so forth). Wafers are transported among and between the units 12-16 by fully-, semi-, or non-automated mechanisms, such as conveyors (not shown), robotic arms 18, manual labor (not shown) and so forth, all as known in the art. One such wafer 20 is shown in an end effector of arm 18.

Each system 12-16 includes one or more subsystems that perform the wafer processing steps of the respective system. Four such subsystems 22-28 are shown with respect to system 12. These include a wafer alignment subsystem 22 according to the invention, as well as three other subsystems of the type known in the art for lithography or other wafer processing steps. Robotic arm 29 or another conveyance (not shown) can be provided within the system 12 for moving the wafer among and between subsystems, e.g., in the conventional manner known in the art. A local controller 32 can also be provided, e.g., for controlling operations within the system 12 in the conventional manner known in the art (as adapted to the teachings hereof), as well as for coordinating operations with the other systems, e.g., via a system controller 34 that controls overall system operations (including that of arm or conveyance 18) in the conventional manner known in the art (again, as adapted to the teachings hereof). It will be appreciated that a greater or lesser number of subsystems and/or conveyances may be used in system 12, and that the other systems 14-16 may be similarly configured.

Wafer alignment subsystem (or "pre-aligner") 22 determines the position and/or alignment (preferably, both) of a wafer 30 in the respective system 12. This insures, for example, that lithography and/or other steps performed by the system 12 are properly directed, both with respect to features inherent to the wafer 30 (e.g., directionally-oriented crystalline structures) and with respect to processing already (or to be) performed on it by other systems 14-16.

More particularly, pre-aligner 22 determines a location of a center and/or other feature of wafer 20. That other feature can be, for example, the wafer's characteristic "flat" or "notch." As well, it can be an alignment mark or other pattern etched or otherwise extent, e.g., on the surface of the wafer. In addition, the pre-aligner 22 determines an orientation of the wafer. In accord with convention, in the illustrated embodiment, this represents an angle of rotation of the wafer flat or notch, though, other embodiments may utilize other features for such orientation determination.

Once it determines the location and/or orientation of the wafer 30, the pre-aligner 22 communicates that to the controller 32 or other components of the illustrated facility 10 so that the wafer can be moved by arms or other conveyances 18, 29 and processed further within system 12, within one or more other systems 14-16, or within the facility 10 as a whole. The pre-aligner 22 communicates location and/or orientation information in a "world" frame of reference (FoR) system 36 that is common to the systems 12-16, though, in other embodiments it may be common only to the respective system 12, one or more other systems 14-16, and/or the facility 10 as a whole. To this end, pre-aligner 22 converts information discerned from images acquired by its camera 40 from the FoR of that camera to the world FoR, as discussed further below and elsewhere herein.

Figure 2A:
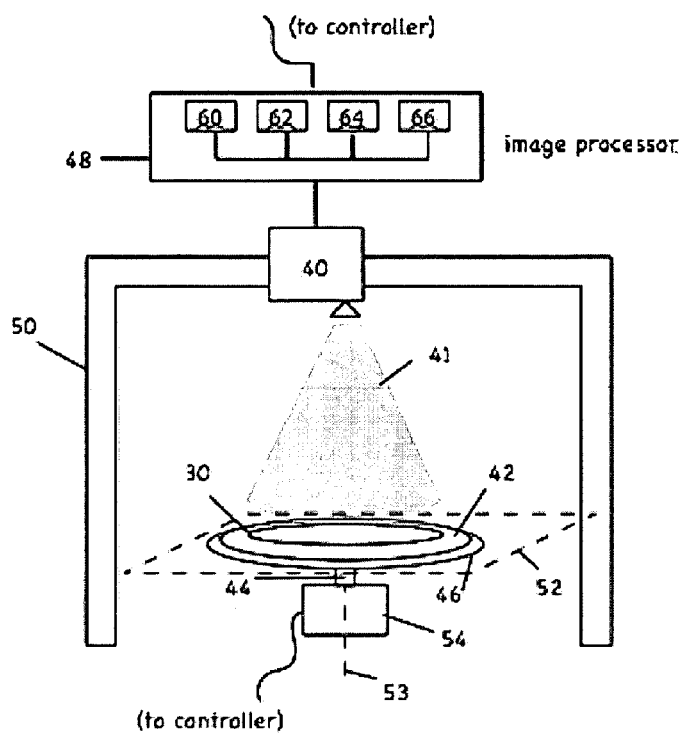
FIGS. 2A and 2B depict further details of a wafer alignment subsystem (or pre-aligner) of the type used in a wafer processing system of FIG. 1.

FIG. 2A depicts further details of a wafer alignment subsystem (or pre-aligner) 22 of FIG. 1. The subsystem 22 includes an image acquisition device (or camera) 40, an illumination source 42, a wafer chuck 44 and platform 46 and an image processor 48, all arranged as shown in the drawing. A frame 50 or other structural element provides rigid support for camera 40 relative to the chuck and platform 44-46, also as shown. Notwithstanding the particular configuration shown in the drawing, those skilled in the art will appreciate that elements 42-50 can be arranged in other ways in accord with the teachings hereof.

Camera 40 comprises a conventional image acquisition device of the type used in the art. Preferably, it is positioned and configured to obtain an image of an entire wafer 30 in a single field of view (FoV) 41, thus, eliminating the need to acquire multiple disparate images in order to discern the position and/or location of the wafer. A benefit of the illustrated pre-aligner is that camera 40 can be of relatively low resolution, e.g., with image pixels that resolve to 650 microns (or better) on the wafer 30 surface and, yet, still permit resolution of wafer location and position to 20 microns (or better). A preferred camera 40 is an In-Sight® available from the assignee hereof.

Source 42 illuminates features of the wafer 30 used for position and/or orientation determination. In the illustrated embodiment, the source 42 backlights the wafer 30 in order to emphasize its perimeter in images that camera 40 acquires and that image processor 48 processes for position and/or orientation determination. Preferably, as in the illustrated embodiment, such backlighting is provided by a low-profile element providing uniform illumination disposed, e.g., at the same level as the platform 46 and just below the wafer 32. Preferably this is accomplished with a circular-shaped platform with a diameter slightly smaller than the wafer and an annular-shaped backlight whose inner diameter is larger than the platform and whose outer diameter is larger than the wafer. Such an element 42 can be fabricated in the manner of the illumination source described in copending, commonly-assigned U.S. patent application Ser. No. 11/162,540, filed Sep. 14, 2005, entitled "Method and Apparatus for Backlighting a Wafer during Alignment," the teachings of which are incorporated herein by reference.

Platform 46 holds the wafer 30 for imaging by camera 40 and rotation by chuck 44. To this end, the platform defines an imaginary plane 52 in which the wafer 30 is held, e.g., by friction, suction, or otherwise. In the illustrated embodiment, that plane 52 is generally normal to an axis of a cone defining the FoV 41 of camera 40, though, in other embodiments, the plane and camera may be oriented otherwise. The plane 52 is, moreover, generally—though, as discussed below, not fully—normal to an axis of rotation 53 of the chuck 44 on which it (the plane 52) is disposed and to which it is rotationally coupled, in the manner known in the art. The chuck is, itself, disposed on and rotationally coupled to a computer-controlled motor 54, as shown, in the manner known in the art.

Figure 2B:
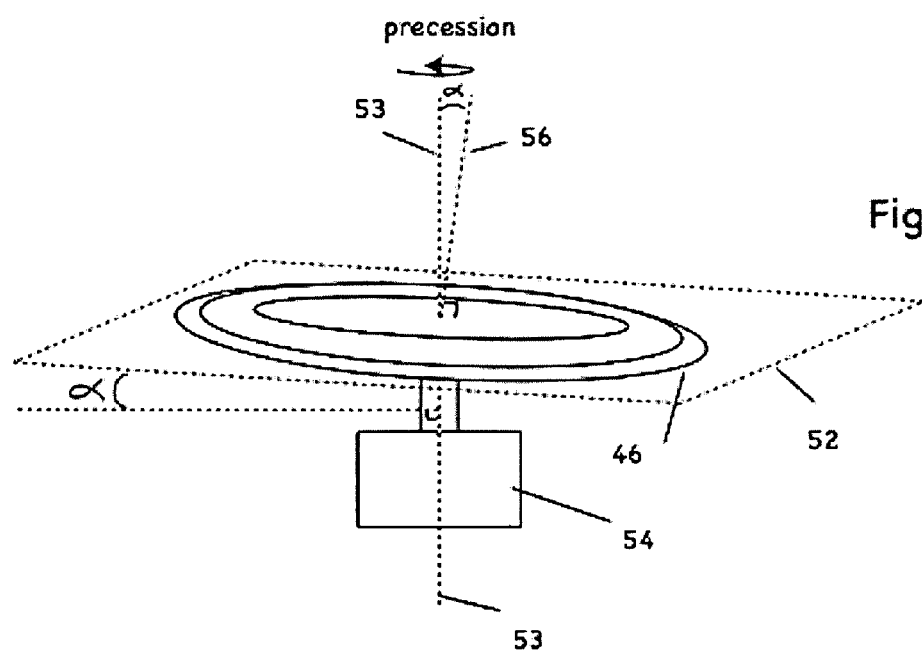

Referring to FIG. 2B, a benefit of the illustrated pre-aligner is that the holding plane 52 defined by the platform 46 need not be normal to the axis of rotation 53 of the chuck (and, hence, the chuck and 46 can be of the less expensive variety known in the art). Indeed, in the illustrated embodiment, the holding plane 52 is disposed at a non-normal (i.e., non-90° angle) $\alpha$ to the axis 53, where $\alpha$ is between 0 0.5 degrees and, preferably, not more than 1.5 degrees. As a consequence, a normal 56 to holding plane 52 precesses (or wobbles) as the chuck 44 rotates. As a further consequence, frames of reference established by the plane 52 vary with the angle of rotation $\omega$ of the platform 46. Or, put another way, the world frame of reference is independent of—though, as discussed below, mappable to—frames of reference established by the rotating platform at its various angles.

Referring back to FIG. 2A, although the chuck and platform 44-46 are shown separately from other components of the system 12, in some embodiments, they form part of the robotic arm 29 (and, particularly, of the end effector thereof), or of other components of the system 12 or facility 10.

Image processor 48 comprises a general- or special-purpose digital data processor of the type known in the art for analyzing images generated by camera 40, e.g., to identify the coordinates of features therein and to perform transformations thereon. To this end, the image processor 48 includes a central processing unit (not shown), memory (not shown) and input/output interface (not shown), all of the conventional type for executing software, e.g., stored in the memory. In the illustrated embodiment, that software causes the image processor 48 to perform the following functions:

1. Trigger camera 40 and capture an image of wafer 30 on platform 46, e.g., in the conventional manner known in the art. This functionality is represented by acquisition module 60 in the drawing.
2. Analyze an image so captured to identify the location of a center of the wafer 30 and/or of other features thereof (such as the wafer's characteristic flat, notch, or otherwise, as discussed above) in the FoR of the camera (and, particularly, the FoR of the captured image), e.g., in the conventional manner known in the art (see, for example, U.S. Pat. No. 5,825,913, System for Finding the Orientation of a Wafer, the teachings of which are incorporated herein by reference). This functionality is represented by analysis module 62 in the drawing.
3. Map the locations so determined from coordinates in the FoR of the image to the coordinate in the world FoR as discussed below. This functionality is represented by mapping module 64 in the drawing.
4. Determine the orientation of the wafer from the mapped locations. Once the mapped locations are determined, as discussed above, the orientation can be determined in the conventional manner known in the art. This functionality is represented by orientation module 66 in the drawing.
5. Send the mapped location(s) and orientation determined therefrom to the controllers 32 and/or 34 so that the wafer 30 can be moved or processed further as discussed above.

Of course, it will be appreciated that the functionality of modules 60-66 may be combined in fewer modules and/or distributed among a greater number, indeed, including to among components of the pre-aligner 22 or system 12 or otherwise.

With respect to module 64, the pre-aligner 22 maps locations determined by module 62 using a mapping function that relates coordinates in the FoR of the wafer image acquired by module 60 to the coordinates in the world FoR. The mapping function, which can be continuous or discrete, defines that relation as a function of the angular rotation of the computer-controlled chuck and platform 44, 46, e.g., as expressed below:

$$[x,y]_{FoR(world)} = f([x,y]_{FoR(image)}, \omega_{platform}) \quad \text{Eq. 1}$$

where, $[x,y]_{FoR(world)}$ is a coordinate in the world frame of reference;

$[x,y]_{FoR(image)}$ is a coordinate in the image frame of reference;

$\omega_{platform}$ is an angle of rotation of the chuck and platform 44, 46

As those skilled in the art will appreciate from the text above, because holding plane 52 established by the platform 46 is not normal to the axis 53, the functions $f$ of Eq. 1 varies with $\omega$. In the illustrated embodiment, that function $f$ is determined empirically, e.g., during assembly or installation of the system 12, pre-aligner 22, by the following steps:

1. placing the chuck and platform 44-46 at a known angle of rotation $\omega$;
2. placing on platform 46 a calibration card or plate (e.g., of overall dimensions similar to a silicon wafer 30) having one or more reference markings whose locations are known in the world FoR (e.g., as determined by independently measuring the location of the calibration card/plate and/or its attendant reference markings from a known reference point or points in the world FoR);
3. imaging the calibration card or plate so marked with camera 40;
4. comparing the coordinates of the reference marks shown in the image (i.e., the image FoR coordinates) with the corresponding world FoR coordiantes;
5. constructing a discrete look-up table and/or a continuous mathematical function (e.g., by quadratic fitting) from the results of such comparison, which function serves in the manner of Eq. 1, above, for the given angle of rotation $\omega$,
6. repeating steps 1-5 for at least one other angle of rotation (and, preferably, for many other angles of rotation) of the chuck and platform 44-46.

Of course, steps 1-6 represent just one way to create the function $f$. Those skilled in the art will appreciate that the function can be constructed in other ways in view of the teachings hereof.

Described above are methods and apparatus meeting the objects set forth earlier, among others. This includes, among other things, improving pre-aligner accuracy so as to handle the small and increasingly smaller tolerances of today's and successive generations of semiconductor manufacturing technology. Those skilled in the art will appreciate that the illustrated embodiments are merely examples of the invention and that other embodiments incorporating modifications thereto fall within the scope of the invention. Thus, by way of example, it will be appreciated that a pre-aligner according to the invention can be utilized with an edge-gripping rotation station that avoids touching the backside of wafers in process and, thereby, minimizes the risk of contamination. In view of the foregoing, what we claim is:

In view of the foregoing, what we claim is:

1. A wafer alignment system, comprising
  A. a rotatable platform,
  B an image acquisition device having a field of view that includes at least a portion of a wafer on the platform,
  C. an illumination source that illuminates at least a portion of the wafer,
  D. an image processor that is coupled to the image acquisition device and that processes an at least two-dimensional image showing one or more characteristics of the wafer in a first frame of reference, the image processor determining therefrom a position and/or orientation of the wafer, or a portion thereof, in a second frame of reference,
  E. the image processor including a mapping element that maps coordinates in the first frame of reference to coordinates in the second frame of reference at each of a plurality of angles of rotation of the platform,
  F. wherein the mapping element maps coordinates in the image of the wafer on the platform to the second frame of reference as a function of the angle of rotation of the platform.

2. The wafer alignment system of claim 1, wherein the platform holds the wafer on a plane having a normal that processes as the platform rotates.

3. The wafer alignment system of claim 2, wherein the platform is disposed on and rotationally coupled to a chuck, the axis of rotation of which is not normal to the holding plane of the platform.

4. The wafer alignment system of claim 3, wherein the platform rotates as the chuck rotates and the normal to the platform's holding plane processes during the course of that rotation.

5. The wafer alignment system of claim 1, wherein the second frame of reference is independent of one or more frames of reference defined by the platform at one or more angles of rotation thereof.

6. The wafer alignment system of claim 1, wherein the second frame of reference is a planar.

7. The wafer alignment system of claim 1, wherein the mapping element comprises a discrete function that maps coordinates in the image of the wafer on the platform to the second frame of reference for each of two or more discrete angles of the platform.

8. The wafer alignment system of claim 1, wherein the mapping element comprises a continuous function that maps coordinates in the image of the wafer on the platform to the second frame of reference as a continuous function of the angle of the platform.

9. The wafer alignment system of claim 1, wherein the illumination source provides backlighting for the wafer on the platform.

10. The wafer alignment system of claim 9, wherein the illumination source provides that backlighting at an angle parallel to the normal to the holding plane of the platform.

11. The wafer alignment system of claim 9, wherein the illumination source is disposed in the holding plane of the platform.

12. The wafer alignment system of claim 11, wherein the illumination source comprises a planar source that is disposed between the wafer and the platform.

13. The wafer alignment system of claim 9, wherein the illumination source comprises an electroluminescent light source.

14. The wafer alignment system of claim 1, wherein the image acquisition device is arranged to acquire an image of the entire wafer in a single field of view.

15. The wafer alignment system of claim 1, wherein the image processor further comprises functionality that determines the position and/or orientation of the wafer, or a portion thereof, in any of the first and second frames of reference as a function of one or more features shown in the image.

16. A method of wafer alignment comprising
  A. acquiring an at least two-dimensional image of a wafer that is disposed on a rotatable platform, the image showing one or more characteristics of the wafer in a first frame of reference,
  B. processing the image to determine therefrom a position and/or orientation of the wafer, or a portion thereof, in a second frame of reference,
  C. the processing step including determining the position and/or orientation by using a mapping element that maps coordinates in the first frame of reference to coordinates in the second frame of reference at each of a plurality of angles of rotation of the platform,
  D. mapping coordinates in the image of the wafer on the platform to the second frame of reference as a function of the angle of rotation of the platform,
  E. using the portion and/or orientation determined in step (B) to position the wafer for any of processing and inspection.

17. The method of claim 16, wherein the platform holds the wafer on a plane having a normal that processes as the platform rotates.

18. The method of claim 16, wherein the second frame of reference is independent of one or more frames of reference defined by the platform at one or more angles of rotation thereof.

19. The method of claim 16, comprising backlighting the wafer during acquisition of the image in step (A).

20. The method of claim 19, comprising disposing an illumination source between the wafer and the platform.

21. The method of claim 19, comprising backlighting the wafer with a planar, electroluminescent light source.

* * * * *